Stanley Bruce Marsh &
John Dickens Clare
Inventors
By Morgan, Finnegan, Durham & Pine
Attorneys Stanley Bruce Marsh &
John Dickens Clare
Inventors
By
Morgan, Finnegan, Durham & Pine
Attorneys Stanley Bruce Marsh & John Dickens Clare
*Inventors*
By
Morgan, Finnegan, Durham & Pine
*Attorneys*

United States Patent Office 3,079,563

Patented Feb. 26, 1963

3,079,563
MICROWAVE FREQUENCY DISCRIMINATOR

Stanley Bruce Marsh and John Dickens Clare, Malvern, England, assignors to James Scott & Co. (Electrical Engineers) Limited, Glasgow, Scotland Filed Jan. 16, 1959, Ser. No. 787,290
14 Claims. (Cl. 329—116)

Figure 1:
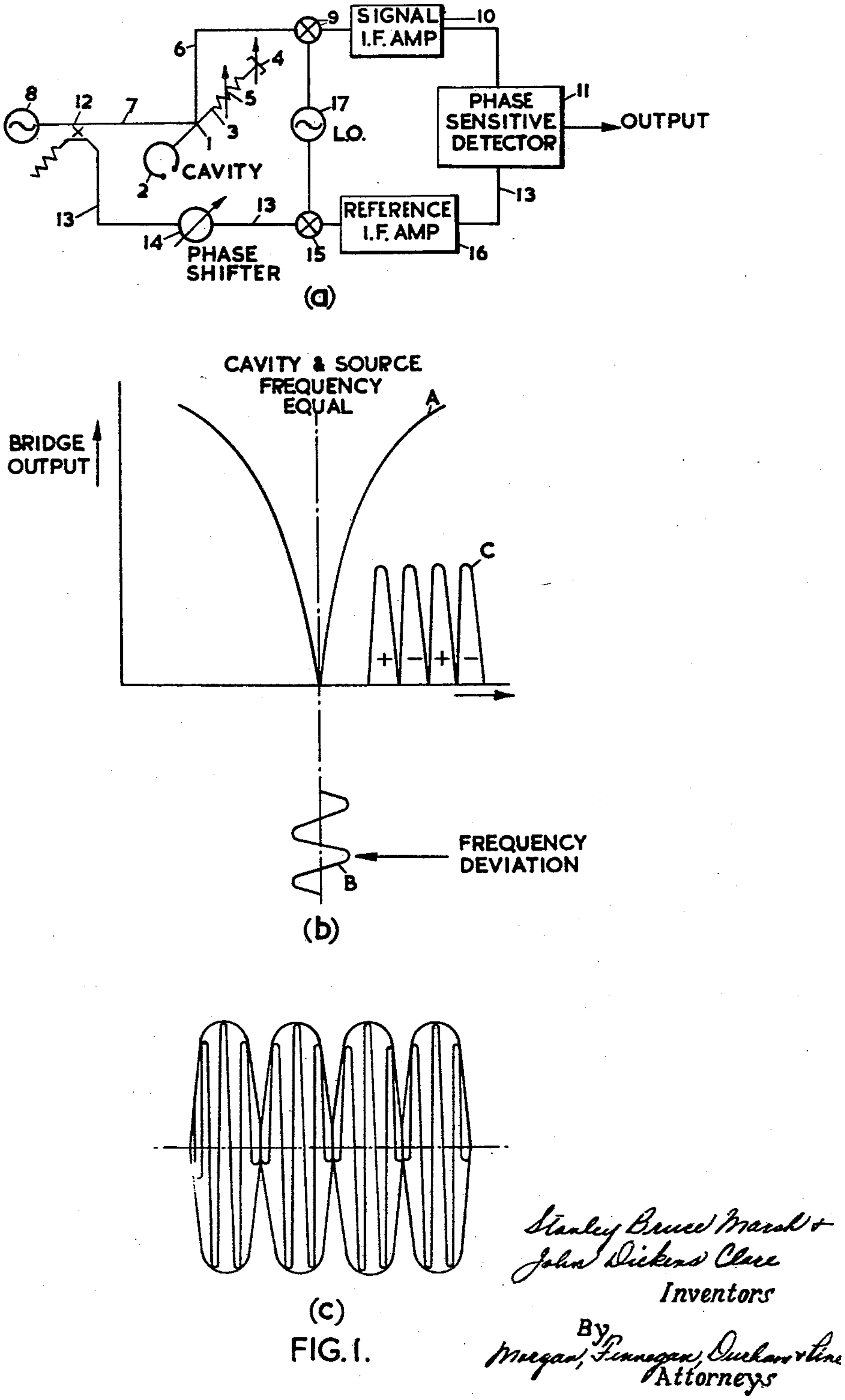

This invention relates to microwave frequency discriminators.

One of the applications of a microwave frequency discriminator is in the examination of unwanted noise modulations in the output of a continuous wave klystron oscillator. These noise modulations can be divided into frequency and amplitude modulations. Generally an amplitude detector is used to detect amplitude modulations and a frequency discriminator is used to detect the frequency modulations so that, for example, further analysis may be completed by a spectrum analyser. An amplitude detector is reasonably simple but a frequency discriminator often presents greater difficulties.

One form of microwave frequency discriminator which has been employed makes use of a microwave cavity to convert a frequency modulation of an input signal to an amplitude modulation. The cavity is tuned so that the nominal frequency of its input signal lies within one side of its resonance curve; the sensitivity of the discriminator, as a converter of frequency to amplitude modulation, is thus dependent upon the slope of resonance curve. Moreover when the frequency modulation of a signal is small any unwanted amplitude modulation present in the signal will tend to mask the amplitude modulation which has been derived by conversion from frequency modulation.

These difficulties can be mitigated to some extent by the use of a cavity having a high Q; there is, however, a limit to the possible improvement which can be achieved in this way. It will be appreciated that the higher the Q of the cavity the more critical its tuning to the nominal frequency would become, and for a given range of modulation frequencies a limit is automatically set for the value of the cavity Q according to the extent of this range.

It is therefore an object of the present invention to provide a microwave frequency discriminator of improved sensitivity; also one in which the effect of amplitude modulation of its input signal is reduced and tuning is not unduly critical.

Certain microwave structures, e.g. hybrid junctions exhibit properties comparable with classical bridge circuits in that a null output may be obtained when certain of the elements structure are balanced. Such a microwave arrangement is contemplated herein and for convenience is characterised as a "bridge."

According to the invention a microwave frequency discriminator comprises a microwave bridge having an input arm, an output arm, an arm connected to a resonant cavity and a balancing arm presenting an adjustable impedance to the bridge whereby, when the bridge is balanced for an input signal of a predetermined datum frequency, variations of frequency of the input signal cause an output signal to be present in the output arm, and an output signal channel connected to the output arm and terminating in a phase-sensitive-detector, whereby the output of the detector varies in amplitude according to the frequency deviation of the input signal to the bridge.

A directive feed may be coupled to the input arm of the bridge to provide a reference frequency signal for the phase-sensitive-rectifier which is related in phase and frequency to the input signal.

An adjustable phase-shifter may be provided to adjust the phase of the reference signal.

Conveniently the phase-sensitive-detector operates at I.F. (intermediate frequency) and separate mixers fed by a common local oscillator are provided to change the frequency of the bridge output and reference signals before they are applied to the phase-sensitive detector.

An envelope-following-detector may be fed from the reference signal derived from the bridge input signal thereby enabling the detection and measurement of amplitude modulation present in the input signal.

As an alternative to the use of the envelope-following-detector for the detection of amplitude modulation a second phase sensitive detector fed from the bridge output and reference signals may be provided. A phase shifter is provided in the reference signal input to this second detector to provide a 90° phase-shift. The output of the second detector then gives a sensitive indication of amplitude modulation on the input signal to the bridge.

Figure 2:
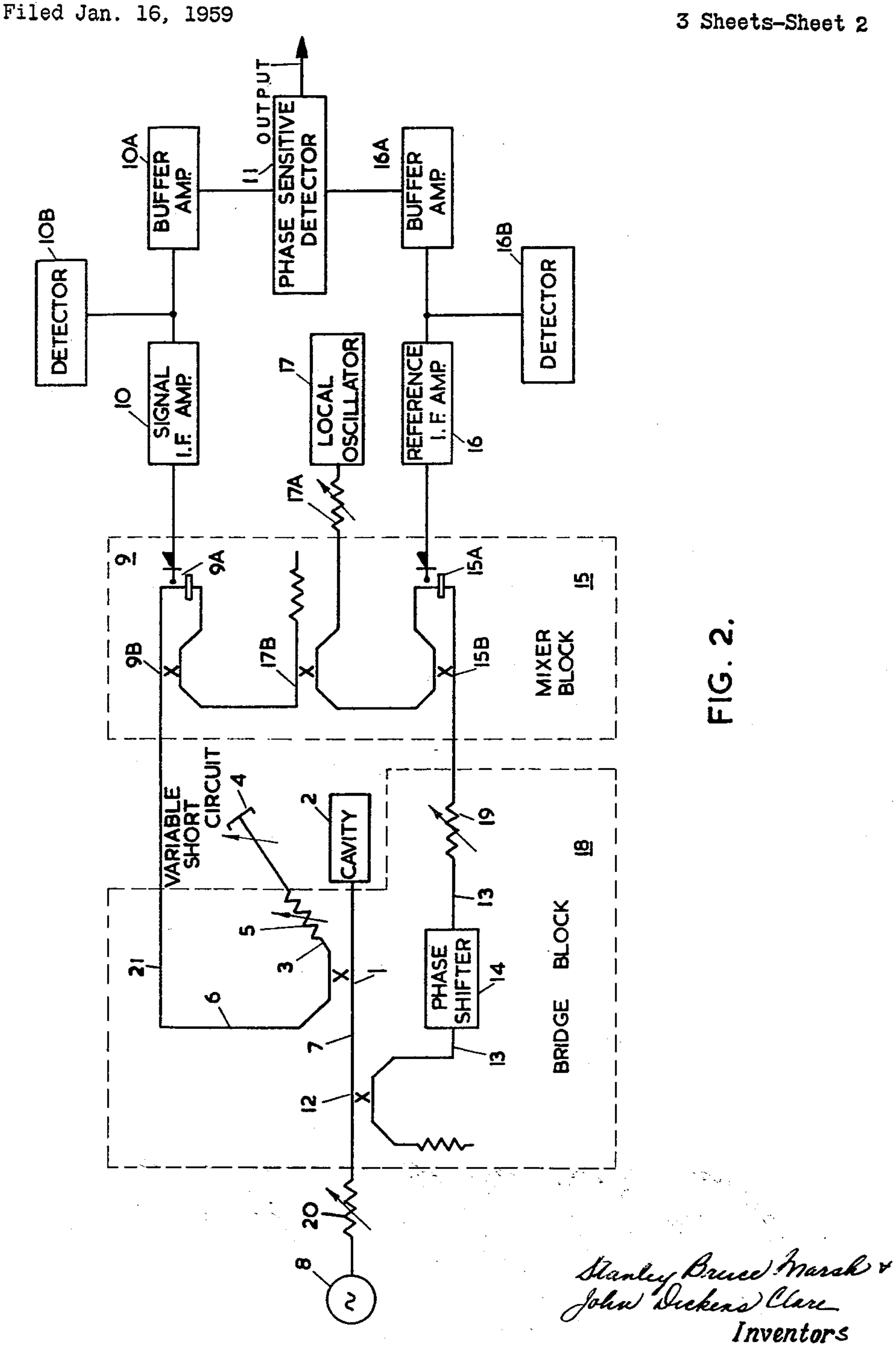
Figure 3:
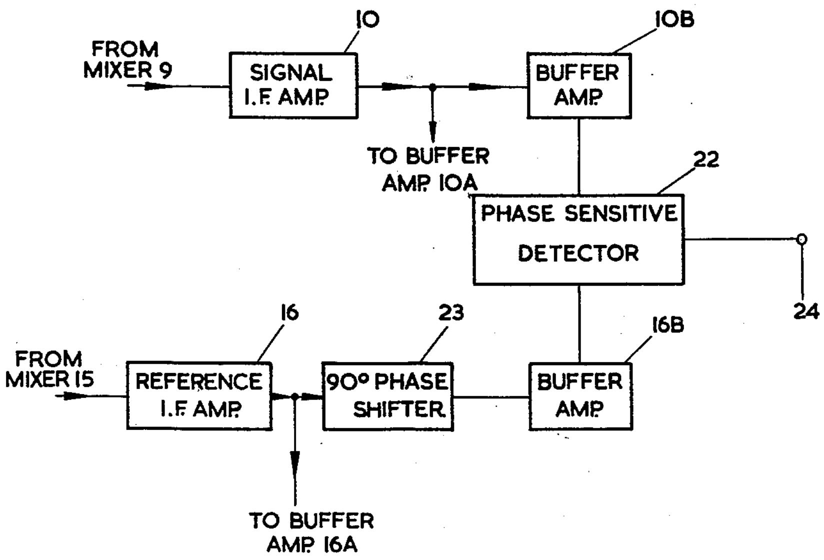

In order to make the invention clearer a short discussion of the principles involved will now be given together with a description, by way of example, of a discriminator according to the invention. Reference will be made to the accompanying drawings in which:

FIGS. 1*a*, *b*, *c* show diagrams useful in appreciating the principle of the invention, FIG. 2 shows schematically the arrangement of one form of discriminator, and FIG. 3 shows a useful addition to the discriminator of FIG. 2.

In FIG. 1*a* a microwave bridge is formed by a hybrid arrangement 1 to which is connected a cavity 2, an arm 3 terminated by a variable short-circuit 4 and containing a variable attenuator 5, an output arm 6 and an input arm 7. The input arm 7 is fed from a source 8 whose frequency modulation it is desired to measure. The output arm 6 of the bridge is connected via a mixer 9 and an I.F. signal amplifier 10 to a phase sensitive detector 11.

A reference signal for the phase sensitive detector 11 is obtained from the source 8 by means of a directive coupling 12 which is inserted in series with the input arm 7 of the microwave bridge. The directive feed 12 couples to a reference channel 13 which contains a phase shifter 14, a mixer 15 and an I.F. reference signal amplifier 16; the output of the reference signal amplifier 16 is fed as a reference signal to the phase sensitive detector 11. The mixers 9 and 15 are fed from a common local oscillator 17.

When balanced by adjustment of the variable attenuator 5 and the adjustable short circuit 4 the bridge exhibits an output characteristic relative to frequency as shown by the curve A of FIG. 1*b*; it will be seen that the zero output point of the bridge occurs when the source frequency and cavity resonant frequency are equal.

If a frequency deviation is present in the output of the source 8 then an output will appear in the output arm 6 of the bridge. This is shown in FIG. 1*b* where a frequency deviation (curve C) about the source frequency produces a bridge output as shown in curve C. The sense of the frequency deviation is not apparent from the amplitude (curve B) of the bridge output but conventional positive and negative signs are shown which indicate the change of phase of the bridge output in the arm 6.

The waveform of the amplitude modulated output signal in the output arm 6 of the bridge is seen in FIG. 1*c*.

The output signal from the output arm 6 of the bridge passes to the mixer 9 where it is reduced to intermediate frequency and subsequently amplified in the amplifier 10 before being applied to the phase sensitive detector 11.

A reference signal is derived from the source 8 and coupled into the reference channel 13 by means of the directive feed 12; it is fed by the channel 13 via the phase shifter 14 to the mixer 15 where it is reduced to intermediate frequency before being amplified in the amplifier 16 and applied as a reference signal to the phase sensitive detector 11.

The output of the phase sensitive detector 11 varies in amplitude correspondingly to the frequency deviation originally present in the input signal to the bridge from the source 8.

It can be shown that the phase of the reference signal at the phase sensitive detector 11 relative to the phase of the signal applied to the detector 11 must be the same, or, different by a multiple of 90°. Accordingly the phase of the reference signal can be adjusted by means of the phase shifter 14 in the reference channel 13. The arrangement of FIG. 1*a*, acting as a frequency discriminator, has the advantage that, by virtue of the use of a bridge, amplitude variation of the output of the source 8 will not materially affect the output signal from the arm 6 of the bridge. In practice then the signal fed to the phase sensitive detector 11 is insensitive to amplitude modulation present in the original signal.

The use of a phase sensitive detector ensures that any unwanted amplitude modulation coming through from the source on the signal and the reference channels is balanced to a large extent at the detector; this still further reduces the effect of amplitude modulation present in the output of the source 8.

It will be appreciated that in operation a specific balance of the bridge is not necessary and, if need be, the balance at the bridge need only be arranged to give, for example, 10 db difference in levels between the signal and reference channels at the phase sensitive detector.

The sensitivity of the discriminator—that is the sensitivity of FM to AM conversion—can be varied by adjusting the power level input of the bridge from the source 8; a calibrated attenuator can be inserted in the reference channel 13 and its setting necessary to maintain, for a given balance of the bridge, a pre-determined reference signal level at the phase sensitive detector 11, will be a measure of the change in sensitivity.

A refinement consists in connecting an envelope following detector to the output of the reference signal amplifier 16. The output of the detector will then give an indication of the amplitude modulation present on the output of the source 8.

A practical arrangement of the discriminator of FIG. 1*a* is shown schematically in FIG. 2. Corresponding parts of FIG. 2 are designated similarly to those in FIG. 1*a*.

The radio frequency section of the discriminator is made up of milled waveguide blocks to give stability and ease of fabrication. Typically an operating frequency of between 8,500 and 10,000 mc./s. is used.

The bridge 1 and the directive feed 12 together with their associated waveguide runs are milled in a bridge block 18. The attenuator 5, conveniently a 30 db adjustable attenuator, of the bridge balancing arm 3 and a calibrated attenuator 19 in the reference channel 13 also form part of the block; the attenuators 5 and 19 are preferably of the glass vane type to ensure stability. The directional coupler 12 is conveniently a 20 db binomial slot coupler. The cavity 2 is attached to the block 18 and is matched to the waveguide in the block to give a V.S.W.R. better than 0.9 over the operating frequency range. The source 8 is attached to the block 18 through a variable attenuator 20.

The bridge block 18 feeds via the signal channel 21 and the reference channel 13 to a mixer block which contains a signal mixer section 9 and a reference mixer section 15; each station consists of a balanced mixer 9A, 15A and a 3 db binomial slot directive feed 9B, 15B. The directive feeds 9B, 15B couple the signal and reference channels 21 and 13 to the mixers 9A and 15A. The local oscillator 17 feeds via an attenuator 17A and a 3 db binomial slot directive waveguide feed 17B to the signal and reference mixer directive feeds 9B and 15B respectively. Outputs from the mixer block are taken from the mixers 9A and 15A to the signal and reference I.F. amplifiers 10 and 16 respectively.

The I.F. amplifiers 10 and 16 feed via buffer amplifiers 10A and 16A to the phase sensitive detector 11. The amplifiers 10A and 16A enable low impedance coupling into the detector 11 to be achieved to give a wide frequency range for balancing the detector 11; the local oscillator tuning is rendered less critical.

In operation the discriminator of FIG. 2 functions in the same way as has been described with reference to FIG. 1*a*. It will be appreciated however that it is important that the levels of the signal and I.F. channels should be maintained at their correct relative settings and to enable this to be achieved envelope following detectors 10B and 16B are provided, at the outputs of the signal and I.F. amplifiers 10 and 16 respectively, for measurement purposes. Additionally the detector 16B enables the amplitude modulation present on the output of the source 8 to be measured.

A more sensitive indication of amplitude modulation may be obtained if a second phase sensitive detector 22 is provided as indicated in FIG. 3. It is fed from the I.F. signal and reference amplifiers 10 and 16 respectively, a 90° phase-shifter 23 being connected in series with its reference signal input. The signal then appearing at the output 24 of the second detector 22 then gives a measure of the amplitude modulation present on the signal input to the bridge. That this is so can be seen from the following short analysis. An expression representing a carrier, $f=2, w$, with AM and FM is $$[1+a(t)]\cos[wt+\theta(t)]-[1+a(t-\tau)]\cos[wt+\theta(t-\tau)]$$

which by trigonometrical processes reduces first to $$\cos[wt+\theta(t)]-\cos[wt+\theta(t-\tau)]+a(t)\cos[wt+\theta(t)]-a(t-\tau)\cos[wt+\theta(t-\tau)]$$

and then to $$-[\theta(t)-\theta(t-\tau)]\sin[wt+\theta(t)]+[a(t)-a(t-\tau)]\cos[wt+\theta(t)]$$

which will be recognised as expressing two oscillations at a carrier frequency $f$ amplitude modulated and in quadrature.

Thus the detected envelope of $$-[\theta(t)-\theta(t-\tau)]\sin[wt+\theta(t)]$$

will give a measure of the FM present in the input signal to the bridge and the detected envelope of the quadrature carrier $$+[a(t)-a(t-\tau)]\cos[wt+\theta(t)]$$

a measure of the AM present in the input signal.

Although described in its application primarily for the detection of frequency modulation noise the discriminator, it will be appreciated, has other applications, for example in the stabilisation of microwave oscillators.

We claim:

1. A microwave frequency discriminator including a microwave bridge and a phase-sensitive detector, the microwave bridge including an input arm, an output arm, a resonant cavity and an adjustable impedance, an arm connected to said resonant cavity and an arm connected to said adjustable impedance, a hybrid junction, said arms being connected to said hybrid junction, an output signal channel connected between said bridge output arm and said phase-sensitive detector, and a reference signal channel connected between said bridge input arm and said phase-sensitive detector in which the reference signal channel includes an adjustable phase shifter.

2. A microwave frequency discriminator including a microwave bridge and a phase-sensitive detector, the microwave bridge including an input arm, an output arm, a resonant cavity and an adjustable impedance, an arm connected to said adjustable impedance, and an arm connected to said resonant cavity, a hybrid junction, said arms being connected to said hybrid junction, an output signal channel connected between said bridge output arm and said phase-sensitive detector, and a reference signal channel connected to said phase-sensitive detector in which the reference signal channel includes an adjustable phase shifter.

3. A microwave frequency discriminator including a microwave bridge and a phase-sensitive detector, the microwave bridge including an input arm, an output arm, a resonant cavity and an adjustable impedance, an arm connected to said adjustable impedance, and an arm connected to said resonant cavity, a hybrid junction, said arms being connected to said hybrid junction, an output signal channel connected between said bridge output arm and said phase-sensitive detector, and a reference signal channel connected to said phase-sensitive detector in which the reference signal channel includes an adjustable phase shifter and in which the reference signal channel further includes an adjustable level setting attenuator.

4. A microwave frequency discriminator including a microwave bridge and a phase-sensitive detector, the microwave bridge including an input arm, an output arm, a resonant cavity and an adjustable impedance, an arm connected to said adjustable impedance, and an arm connected to said resonant cavity, a hybrid junction, said arms being connected to said hybrid junction, an output signal channel connected between said bridge output arm and said phase-sensitive detector, a directional coupler, and a reference signal channel connected to said bridge input arm, by means of said directional coupler, and to said phase-sensitive detector.

5. A discriminator as claimed in claim 4, in which each of the output and reference signal channels includes an intermediate frequency stage.

6. A discriminator as claimed in claim 5, in which each of said intermediate frequency stages includes a mixer and an amplifier, a local oscillator being connected to feed said mixers.

7. A microwave frequency discriminator including a microwave bridge and a phase-sensitive detector, the microwave bridge including an input arm, an output arm, a resonant cavity and an adjustable impedance, an arm connected to said adjustable impedance, an arm connected to said resonant cavity, a hybrid junction; said arms being connected to said hybrid junction, an output signal channel connected between said bridge output arm and said phase-sensitive detector, said output signal channel including a mixer and an intermediate frequency amplifier, a directional coupler, a reference signal channel connected to said bridge input arm, by means of said directional coupler, and to said phase-sensitive detector, said reference signal channel including a mixer and an intermediate frequency amplifier, and a local oscillator connected to feed said mixers.

8. A discriminator as claimed in claim 7, in which the reference signal channel includes an adjustable phase shifter.

9. A discriminator as claimed in claim 7 in which the reference signal channel includes means to generate a signal indicating the amplitude modulation of the signal in the reference signal channel.

10. A discriminator as claimed in claim 8, in which the reference signal channel also includes an adjustable level-setting attenuator.

11. A discriminator as claimed in claim 10, in which the signal-generating means include an envelope-following demodulator.

12. A discriminator as claimed in claim 11, in which the output signal channel includes an envelope following demodulator.

13. A microwave frequency discriminator including a microwave bridge and a first and a second phase-sensitive detector, the microwave bridge including an input arm, an output arm, a resonant cavity and an adjustable impedance, an arm connected to said adjustable impedance, an arm connected to said resonant cavity, a hybrid junction, said arms being connected to said hybrid junction, an output signal channel connected between said bridge output arm and said first phase-sensitive detector, said output signal channel including a first mixer and an intermediate frequency amplifier, a directional coupler, a reference signal channel connected to said bridge input arm, by means of said directional coupler, and to said first phase-sensitive detector, said reference signal channel including a second mixer and an intermediate frequency amplifier, a local oscillator being connected between said first and second mixers, and a 90° phase shifters, said 90° phase shifter being connected in series with said second phase-sensitive detector across said first phase-sensitive detector.

14. A discriminator as claimed in claim 13, in which the reference signal channel includes a phase shifter and an adjustable level-setting attenuator between said directional coupler and said second mixer.

References Cited in the file of this patent

UNITED STATES PATENTS

| | | |
|---|---|---|
| 2,561,182 | Crane | July 17, 1951 |
| 2,691,734 | Beck et al. | Oct. 12, 1954 |
| 2,770,729 | Dicke | Nov. 13, 1956 |
| 2,883,533 | Ruthroff | Apr. 21, 1959 |
| 2,886,705 | Smith et al. | May 12, 1959 |
| 2,905,902 | Standberg | Sept. 22, 1959 |